United States Patent
Panacek

(10) Patent No.: US 10,840,902 B2
(45) Date of Patent: Nov. 17, 2020

(54) MULTI-FUNCTIONAL PIN OF AN INTEGRATED CIRCUIT

(71) Applicant: Texas Instruments Incorporated, Dallas, TX (US)

(72) Inventor: Jiri Panacek, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/256,415

(22) Filed: Jan. 24, 2019

(65) Prior Publication Data

US 2020/0244259 A1 Jul. 30, 2020

(51) Int. Cl.
| | |
|---|---|
| *H03K 17/22* | (2006.01) |
| *H03L 5/00* | (2006.01) |
| *G06F 1/24* | (2006.01) |
| *G06F 1/28* | (2006.01) |
| *H03K 17/687* | (2006.01) |
| *H03K 5/24* | (2006.01) |

(52) U.S. Cl.
CPC .............. *H03K 17/687* (2013.01); *H03K 5/24* (2013.01)

(58) Field of Classification Search
CPC ................................ H03K 17/687; H03K 5/24
See application file for complete search history.

(56) References Cited

U.S. PATENT DOCUMENTS

| | | | | |
|---|---|---|---|---|
| 8,436,664 B2* | 5/2013 | Wang | ......................... | G06F 1/28 327/142 |
| 8,618,834 B2* | 12/2013 | Mangattur | ......... | H03K 19/1732 326/38 |
| 9,203,295 B2* | 12/2015 | Lee | ....................... | H02M 1/126 |

* cited by examiner

*Primary Examiner* — Kenneth B Wells
(74) *Attorney, Agent, or Firm* — Michael A. Davis, Jr.; Charles A. Brill; Frank D. Cimino

(57) ABSTRACT

In described examples, an integrated circuit comprising a first pin and a second pin. A switchable resistive element is coupled between the first pin and the second pin and has a pull down resistance state or a high resistance state. A comparator has a first comparator input coupled with the first pin, a reference signal input, and a comparator output. A logic circuit has an input coupled with the comparator output, an internal power good signal input, and a control signal output. The control signal output is coupled with the switchable resistive element to select the pull down resistance state or the high resistance state.

16 Claims, 5 Drawing Sheets

MULTI-FUNCTIONAL PIN OF AN INTEGRATED CIRCUIT

BACKGROUND

The size of integrated circuit (IC) devices is decreasing due to an increasing level of integration. Pins are necessary to provide a wired connection with the electronic components of an IC. Also the pins decrease in size to reduce the size of the IC but further measures are necessary to reduce chip size and pin count without losing functionality.

SUMMARY

In described examples, an integrated circuit comprises a first pin and a second pin. A switchable resistive element is coupled between the first pin and the second pin and has a pulldown resistance state or a high resistance state. A comparator has a first comparator input coupled with the first pin, a reference signal input, and a comparator output. A logic circuit has an input coupled with the comparator output, an internal power good signal input, and a control signal output. The control signal output is coupled with the switchable resistive element to select the pull down resistance state or the high resistance state.

A system comprises the integrated circuit and further a second resistive element coupled between a supply voltage and the first pin, a control circuit coupled with the first pin and comprising a control element for controlling the external enable signal.

An integrated circuit comprises a first pin for receiving a first voltage and configured to connect the first voltage to a second or common reference pin via a pull down resistor in a pull down resistance state resulting in an external enable signal at the first pin, or disconnect the first voltage from the common reference pin in a high resistance state resulting in an external power good signal at the first pin.

A method of operating an integrated circuit comprises the steps of applying a first voltage at a first pin of the integrated circuit; connecting the first pin with a second pin of the integrated circuit via a resistive element resulting in a logic low of an external power good signal; in response to an internal power good signal being logic high electrically disconnecting the first pin and the second pin resulting in a logic high of an external power good signal.

DETAILED DESCRIPTION OF EXAMPLE EMBODIMENTS

In order to minimize the area of an integrated circuit (IC) it may be necessary to also consider reduction of the number of pins as each pin may increase the size of the packaged IC. Also, the reduction of the number of pins reduces the cost of an IC as every pin has to be coupled via a bonding wire to the inside of the IC, e.g. to a wafer die. A pin in the context of this invention comprises any electrical connection provided on the IC packaging, e.g. pin, solder ball, ball grid array, land grid array, or other connection solutions.

Figure 1:
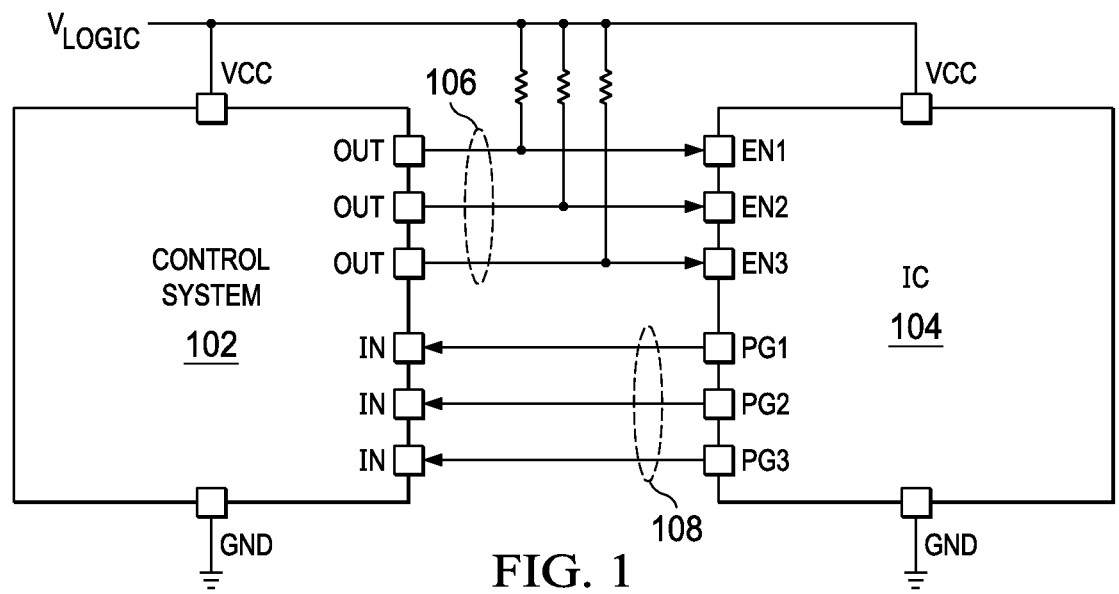
FIG. 1 is a block diagram of a system with separate enable and power good signaling.

FIG. 1 shows a system comprising a control system 102 and a power IC 104. Both the control system 102 and the power IC 104 are coupled with a supply voltage Vcc and ground GND. The control system 102 provides power enable signals EN1, EN2 and EN3 106 to the power IC 104 and the power IC 104 returns power good signals PG1, PG2, PG3 108. Both the control system 102 and the power IC 104 need six pins, namely the control system 102 needs three output pins for sending EN1, EN2 and EN3 and three input pins for receiving PG1, PG2 and PG3. For example, the control system 102 sends an enable signal EN1 to activate a first switchable power supply (not shown) and once the first switchable power supply is operating the power IC 104 returns a power good signal PG1 to the control system 102 to inform that the first switchable power supply is activated and operating.

Figure 2:
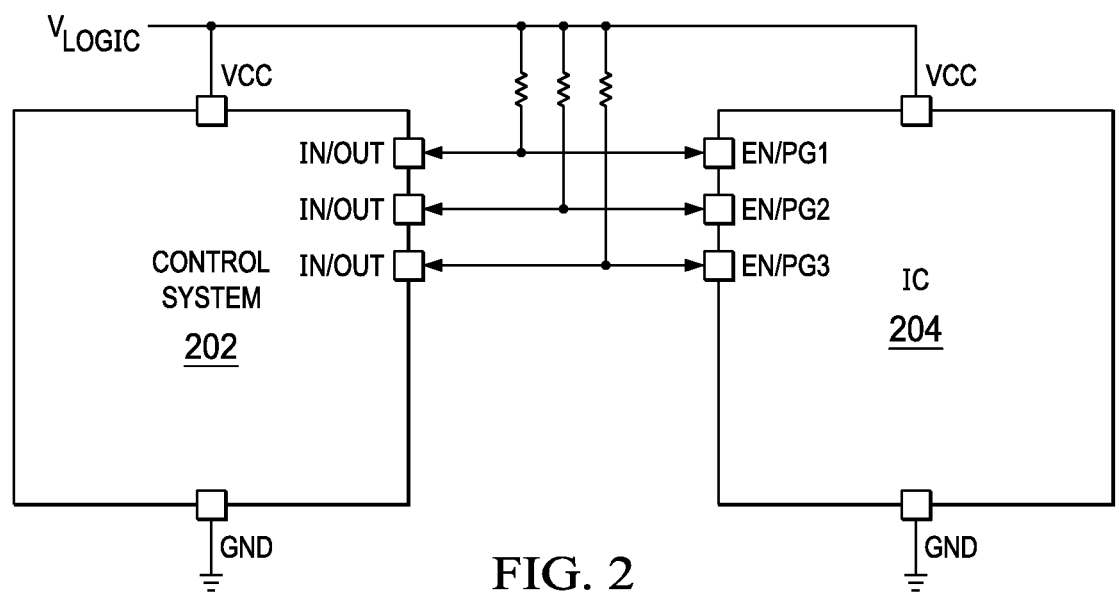
FIG. 2 is a block diagram of a system with combined enable and power good signaling.

FIG. 2 shows a circuit corresponding to FIG. 1, however, with combined enable and power good signaling. In particular, the control system 202 and the power IC 204 are coupled via three instead of six EN/PG lines, namely EN/PG1, EN/PG2 and EN/PG3. The control system 202 needs only three pins for signaling enable and power good for three separate power supplies. Also the power IC 204 has only three pins and the pins are bidirectional pins. For example, the control system 202 sends an enable signal EN1 to the power IC 204 to activate a first switchable power supply (not shown) and once the first switchable power supply is operating the power IC 204 returns a power good signal PG1 to the control system 202 via the same pin it received the enable signal EN1, to inform that the first switchable power supply is activated and operating. The combined enable and power good signal lines are each coupled to Vcc via a respective pull up resistor which will be explained in more detail later on.

Figure 3:
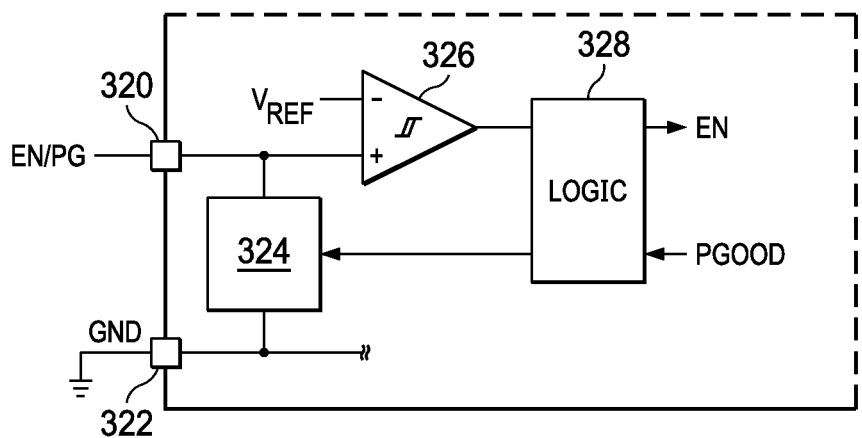
FIG. 3 illustrates an integrated circuit.

An integrated circuit like the power IC104, 204 of FIG. 1 or 2 may comprise pins like a first pin, e.g. any of EN/PG1, EN/PG2, EN/PG3, and a second pin, e.g. a GND pin, as shown in FIG. 3. ICs may comprise between 6 pins and more than 100 pins. This disclosure only focusses on the pins relevant for the enable and power good signaling. For example, the first pin 320 is a combined enable and power good pin and the second pin 322 is coupled with an electrical reference level, e.g. ground level.

A switchable resistive element 324 is electrically coupled between the first pin and the second pin and has a pull down resistance state or a high resistance state. In the pull down resistance state the switchable resistive element 324 has an electrical resistance which is typical for a pull down resistor. It can have an electrical resistance value between $1\Omega$ and $10\ k\Omega$, $10\Omega$ and $5\ k\Omega$, $100\Omega$ and $5\ k\Omega$. In the high resistance state the switchable resistive element 324 has a resistance value which can correspond to an electrical break. It can be in the $M\Omega$ range, e.g. greater than $1\ M\Omega$ or greater than $5\ M\Omega$ or greater than $10\ M\Omega$ or greater than $50\ M\Omega$. In the high resistance state the switchable resistive element 324 should not or not substantially electrically pull down a voltage on the first pin 320 to the voltage level of the second pin 322.

A comparator 326 has a first comparator input coupled with the first pin 320, a reference signal input for receiving a reference signal $V_{REF}$, and a comparator output. The reference signal $V_{REF}$ can be predetermined such that an expected change of the voltage level on the first pin 320 leads to a change of the output of the comparator 326. This effect can be used to amplify a voltage, e.g. from below a logical high level to a logical high level. This effect can also be used to ensure certain voltage levels. Depending on the design the first pin 320 can be coupled with the non-inverting input of the comparator 326 and the reference voltage $V_{REF}$ can be coupled with the inverting input of the comparator 326. Also, the first pin 320 can be coupled with the inverting input of the comparator 326 and the reference voltage $V_{REF}$ can be coupled with the non-inverting input of the comparator 326.

A logic circuit 328 has an input coupled with the output of the comparator 326. The logic circuit 328 further has an internal power good signal input, and a control signal output. The logic circuit 328 may have an internal enable signal output for enabling a switchable power supply corresponding to the external enable power good signal of the first pin 320. The control signal output of the logic circuit 328 controls the switchable resistive element 324 and can select the pull down resistance state or the high resistance state. The switchable resistive element 324 is in a pull down resistance state unless the logic circuit 328 receives a logical high on the internal power good input (indicating that the enabled switchable power supply is properly operating). When the logic circuit 328 receives a logical high on the internal power good input the control signal output changes the switchable resistive element 324 to a high resistance state. In other words, receiving the internal power good signal the logic circuit 328 in combination with the switchable resistive element 324 can generate the external power good signal. Optionally, an external enable signal on the first pin 320 can be used to generate an internal enable signal.

Figure 4:
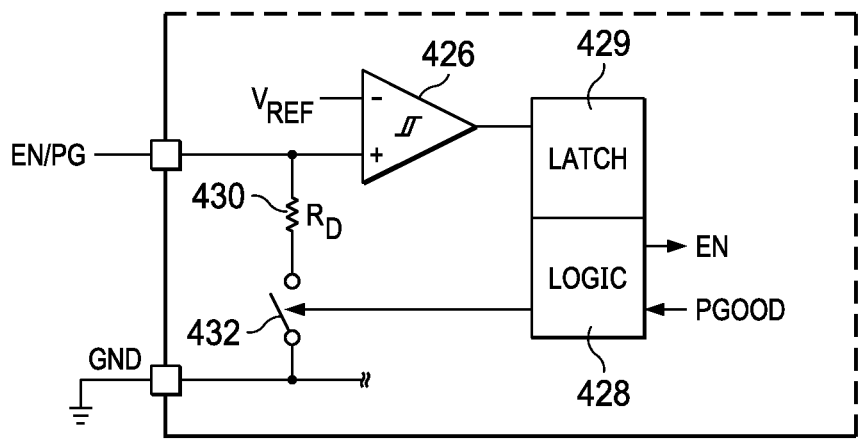
FIG. 4 illustrates an integrated circuit with an exemplary implementation of a switchable resistive element.

Further resistance states of the switchable resistive element 324 can be implemented to maximize use of the first pin 320 to have not only two resistance states but, e.g. four states for signaling two combined enable/power good signals, eight states for signaling four combined enable/power good signals, or more. For example, the switchable resistive element 324 can be implemented by a series connection of a pull down resistor 430 and a switch 432 as shown in FIG. 4. The switch 432 can be directly or indirectly coupled with the control signal output and be controlled by the control signal from the logic circuit 428, which can further comprise a latch 429 to buffer data from the comparator 426. An electrically closed switch 432 corresponds to the pull down resistance state and an electrically open switch 432 corresponds to the high resistance state.

The switchable resistive element 324 of FIG. 3 can be implemented by a controllable resistor (not shown) or a transistor controlled at the gate to assume different drain/source (or collector/emitter) resistances, e.g. corresponding to the series connection of a resistor and a switch and having the same technical effect. The controllable resistor and transistor can be controlled to assume more than two resistance states. The same can be achieved by using a resistor network as switchable resistive element 324. In the following many times reference will be made to the implementation with a series connection of a resistor and a switch. This easy implementation is only used as it is easy to understand. Whenever this example is discussed, also all the other alternatives can be used unless it is explicitly mentioned that only one implementation can be used.

The switchable resistive element 324 of FIG. 3 can have or assume the pull down resistance in response to an internal power good signal indicating that an enabled switchable power supply is not within an operating range. The control signal of the logic circuit 328 outputs a signal, e.g. logical high, to close the switch of the exemplary pull down resistor and switch implementation. The switchable resistive element 324 can have the high resistance in response to the internal power good signal indicating that the enabled switchable power supply is within an operating range. The internal power good signal and the internal enable signal are the signals which have been coupled each to a separate pin, but to reduce pin count the two signals are combined onto one pin, namely the first pin 320. The additional internal logic needed on the IC is smaller and cheaper than an additional pin.

The first pin 320 can be configured to receive a first voltage whereas the switchable resistive element 324 in a pull down resistance state can connect the first pin 320 to the second pin 322 via a pull down resistance element, like a resistor, resulting in an external enable signal at the first pin 320. This external enable signal at the first pin 320 has a voltage level lower than the first voltage. In a high resistance state the switchable resistive element 324 can electrically disconnect the first pin 320 and the second pin 322 resulting in an external power good signal at the first pin 320. This external power good signal at the first pin 320 has a voltage level higher than the enable signal and up to the first voltage.

An internal or external power good signal monitor circuit can be coupled with the first pin 320 to monitor the external power good signal. The monitor circuit can determine the enabled switchable power supply to be within an operating range in response to the external power good signal being logical high and to be disabled/out of an operating range in response to the external enable signal being logical low. The external enable signal has a lower voltage level than the external power good signal. For example, the external enable signal voltage can be in a range which corresponds to a logic low for the power good signal monitor and the external power good signal voltage can be in a range which corresponds to a logic high for the power good signal monitor.

In the context of the logical voltage levels following table 1 provides an exemplary overview over some voltage levels for known logic families.

TABLE 1

|  | LVC-1.8 | LVC-3.3 | LVC-5.0 | HC-2.0 | HC-4.5 | HCT5.0 |
| --- | --- | --- | --- | --- | --- | --- |
| VLOGIC | 1.8 | 3.3 | 5 | 2 | 4.5 | 5 |
| VOH | 1.7 | 3.2 | 4.9 | 1.9 | 4.4 | 4.4 |
| VIH | 1.17 | 2.15 | 3.25 | 1.5 | 3.15 | 2 |
| VIL | 0.63 | 1.16 | 1.75 | 0.5 | 1.35 | 0.8 |
| VOL | 0.1 | 0.1 | 0.1 | 0.1 | 0.1 | 0.1 |

VLOGIC is the digital logic supply voltage; VOH is the logic high-level output voltage; VIH is the logic high-level input voltage; VIL is the logic low-level input voltage; VOL is the logic low-level output voltage. For example, a received voltage of up to 0.63V in LVC-1.8 would be considered a logical low or 0. A received voltage of greater 1.17V would be considered a logical high or 1.

Figure 5:
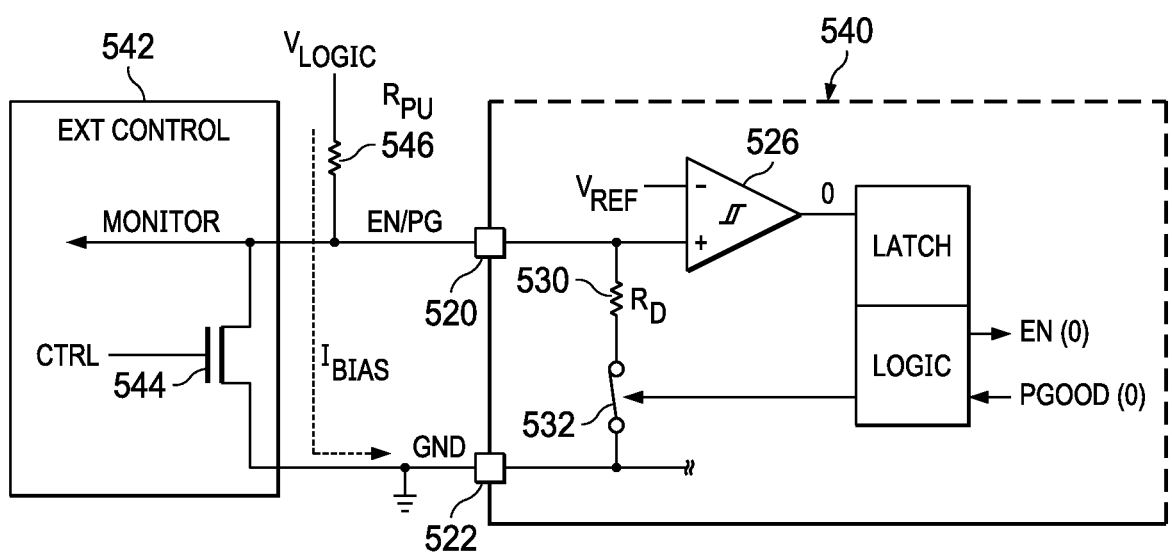
FIG. 5 illustrates a system in off state.

FIG. 5 shows an exemplary system comprising IC 540 coupled with a control circuit 542. The control circuit 542 comprises a control element 544 for controlling the external enable signal on the first pin 520. The control element 544, which can have the electrical properties of a switch with a control input, is coupled on one end with the first pin 520 of IC 540 and on the other end with the second pin 522 of IC 540. The first pin 520 is coupled with the supply voltage $V_{LOGIC}$ via a pull up resistor 546. The pull up resistor 546 can be comprised by IC 540 or the control circuit 542 or external to both. The second pin 522 is coupled with ground GND. The first pin 520 can be coupled with a monitor circuit for monitoring the power good signal (indicated by the arrow in the control circuit 542). The series connection of the pull down resistor 530 and the switch 532 is electrically coupled between the first pin 520 and the second pin 522. As discussed earlier, the switchable resistive element in form of the pull down resistor 530 and the switch 532 is in a pull down resistance state (the switch 532 is electrically conducting) unless the logic 528 receives an internal power good signal.

In FIG. 5 shows an off state wherein the external enable signal is disabled or logical low. The control element 544 bypasses the bias current $I_{BIAS}$ from the $V_{LOGIC}$ power supply such that the current $I_{BIAS}$ flows via the pull up resistor 546 through the control element to ground. In this way the current $I_{BIAS}$ cannot flow from the first pin 520 to the second pin 522 and cannot cause a voltage on the pull down resistor 530. In other words, there is a logical low on the first pin 520.

Figure 6:
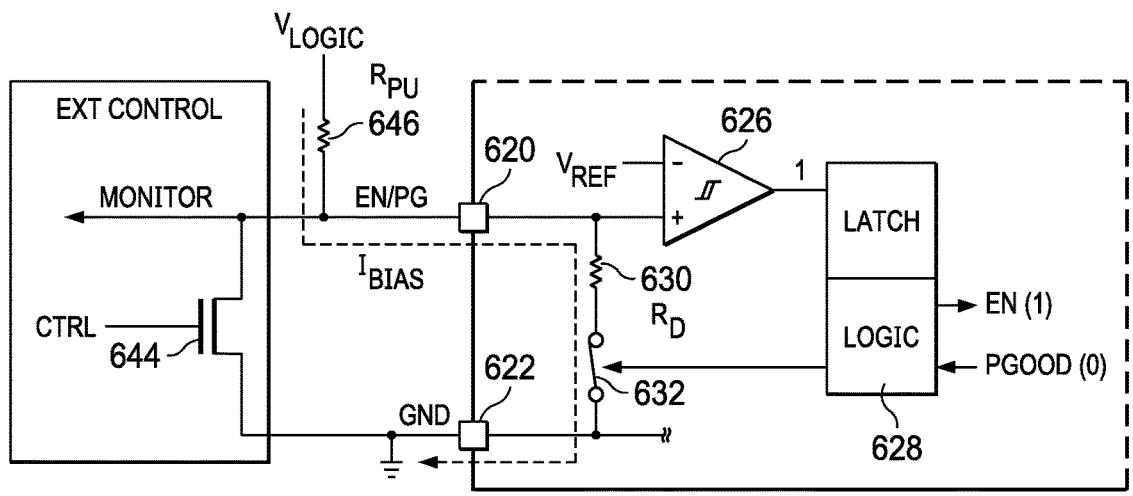
FIG. 6 illustrates a system in startup state.

FIG. 6 shows a startup state in which the external enable voltage is present at the first pin 620 to enable or power up a switchable power supply. The control element 644 now behaves like an open switch and the bias current $I_{BIAS}$ from the $V_{LOGIC}$ power supply flows via the pull up resistor 646 through the first pin 620, the pull down resistor 630, the switch 632 and the second pin 622 to ground GND. The pull up resistor 646 and the pull down resistor 630 form a voltage divider. The resistors are dimensioned such that the voltage at the first pin 620 and at the comparator input coupled with the first pin 620 is higher than the reference voltage $V_{REF}$. The voltage at the resistor 630 is the enable signal voltage which is considered a logical low at the monitor circuit monitoring the external power good signal. The comparator 626 outputs a logical high and the logic circuit 628 outputs an internal enable signal to power up a switchable power supply.

Figure 7:
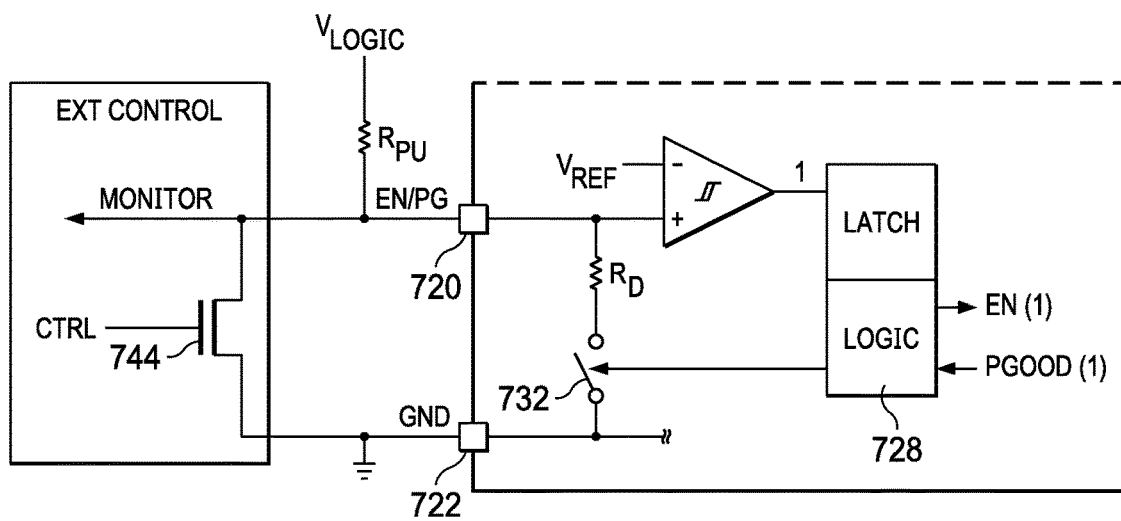
FIG. 7 illustrates a system in run state.

FIG. 7 shows a run state in which the external power good voltage is applied to the first pin 720 to indicate to the monitor circuit that the switchable power supply is powered up and ready to be used. Once the switchable power supply is powered up and works within a certain operating range the logic circuit 728 receives the internal power good signal and in turn changes the control signal controlling the switch 732 to open the same. Once the switch 732 is opened, corresponding to the high resistance state of the switchable resistive element, the voltage on the first pin 720 increases to the power good signal level.

This power good signal level is maintained unless the external enable signal is switched off by the control element 744 (e.g. connecting the first pin 720 with the second pin 722 and thus with ground level) thereby also signaling a logical low to the monitor circuit. The comparator output signal changes and the logic circuit 728 provides a logic low on the internal enable signal. The switchable power supply is switched off and the internal power good signal changes to logical low. If the logic circuit 728 receives a logical low on the internal power good signal input, the control signal output changes to close the switch 732, corresponding to a pull down resistance state of the switchable resistive element. The system is in the off state corresponding to FIG. 5.

The external power good signal level at the first pin 720 can also be ended by the switchable power supply no longer providing an internal power good signal to the logic circuit 728, i.e. providing a logic low on the internal power good signal. The control signal of the logic circuit 728 changes to close the switch 732, corresponding to a pull down resistance state of the switchable resistive element. The system is in the off state corresponding to FIG. 5.

Figure 8:
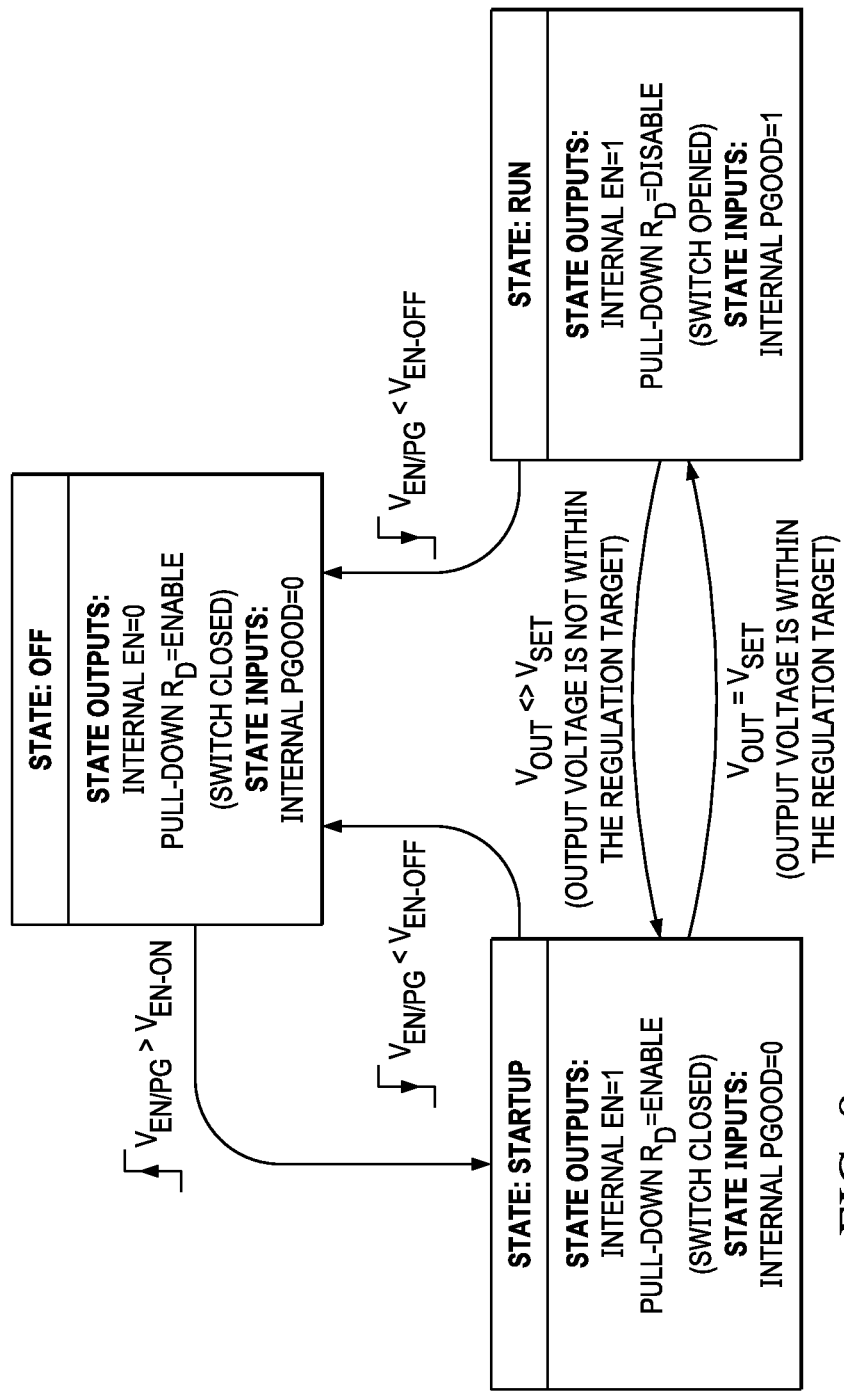
FIG. 8 illustrates a state diagram of the logic circuit.

With reference to FIG. 8 in combination with FIG. 3 the states and function of the logic circuit 328 will be explained. In the off state, the logic circuit 328 receives a logical low from the comparator output indicating that no external enable signal is present at the first pin 320. The internal enable signal output is logical low. The control signal output is logical high such that the switchable resistive element is in a pull down resistance state. In one exemplary implementation using a series connection of a pull down resistor and a switch as switchable resistive element the switch is controlled to be closed, i.e. electrically conducting. The internal power good signal is logical low as the switchable power supply is not enabled and thus not working.

Once the voltage on the first pin 320 increases to reach the external enable signal voltage level, the state transitions to the startup state. In the startup state, the logic circuit 328 receives a logical high from the comparator output indicating the external enable signal on the first pin 320. The internal enable signal output is at logical high to enable or start up the switchable power supply. The control signal output is logical high such that the switchable resistive element is in a pull down resistance state. The internal power good signal is logical low. Should the voltage on the first pin 320 decrease to a logical low the state of the logic circuit 328 transitions back to the off state.

In the run state, the logic circuit 328 receives a logical high from the comparator output. The internal enable signal output provides a logical high. The internal power good signal is at logical high indicating that the switchable power supply is within a target operating range. The control signal output is logical low such that the switchable resistive element is in a high resistance state.

If the logic circuit 328 is in the run state and the external enable voltage is changed to a logical low, e.g. by controlling the control element 544 as explained in combination with FIG. 5, the logic circuit 328 changes to the off state.

If the logic circuit 328 is in the run state and the internal enable signal is changed to a logical low, e.g. the switchable power supply is not within a regulation target, the logic circuit 328 changes to the startup state.

Figure 9:
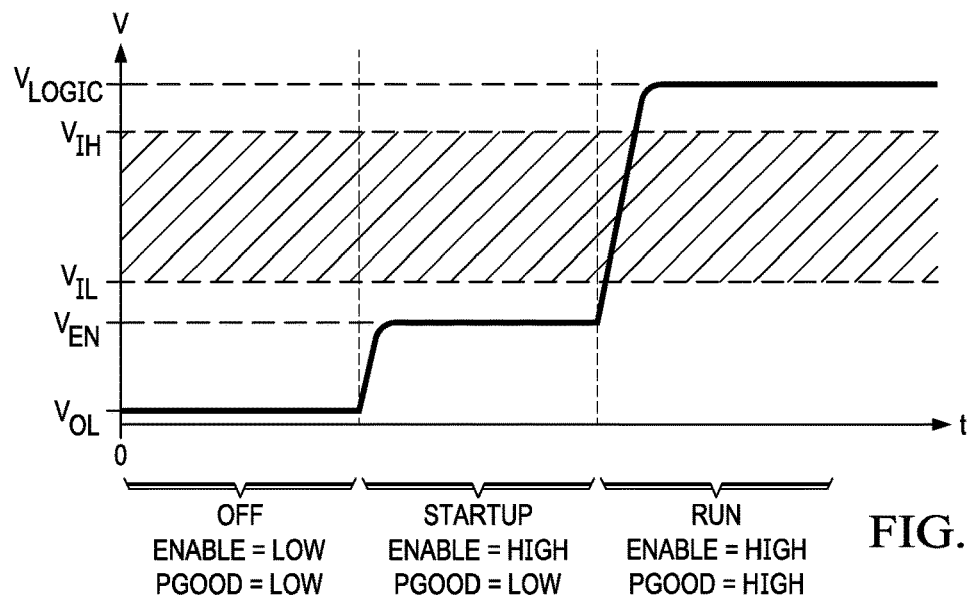
FIG. 9 illustrates the voltage at the first pin during off state, startup state and run state.

FIG. 9 shows the voltage at the first pin 520 in the off state, the startup state and the run state. In the off state, where the external enable signal is logical low, the voltage level at the first pin 520 is VOL. VOL and $V_{REF}$ at the comparator 526 have to be selected such that VOL is lower than $V_{REF}$ (in a set up where the first pin 520 is coupled with the non-inverting input of the comparator 526 and a logical high at the comparator output indicates the presence of the external enable signal).

The voltage at the first pin 520 increases to the external enable signal voltage $V_{EN}$ in the startup state. The external enable signal voltage $V_{EN}$ is higher than $V_{REF}$ and the comparator 5100 outputs a logical high indicating the presence of an external enable signal voltage. At the same time the external enable signal voltage $V_{EN}$ is low enough to qualify as a logical low for an optional monitor circuit monitoring the external power good signal.

The voltage at the first pin 520 increases to the external power good signal voltage $V_{PG}$, which can correspond to the supply voltage $V_{LOGIC}$, in the run state. The external power good signal voltage $V_{PG}$ is higher than and qualifies as the external enable signal to ensure that the comparator 526 outputs a logical high to the logic circuit 528. At the same time the external power good signal voltage $V_{PG}$ is high enough to qualify as a logical high for the optional monitor circuit monitoring the external power good signal.

Figure 10:
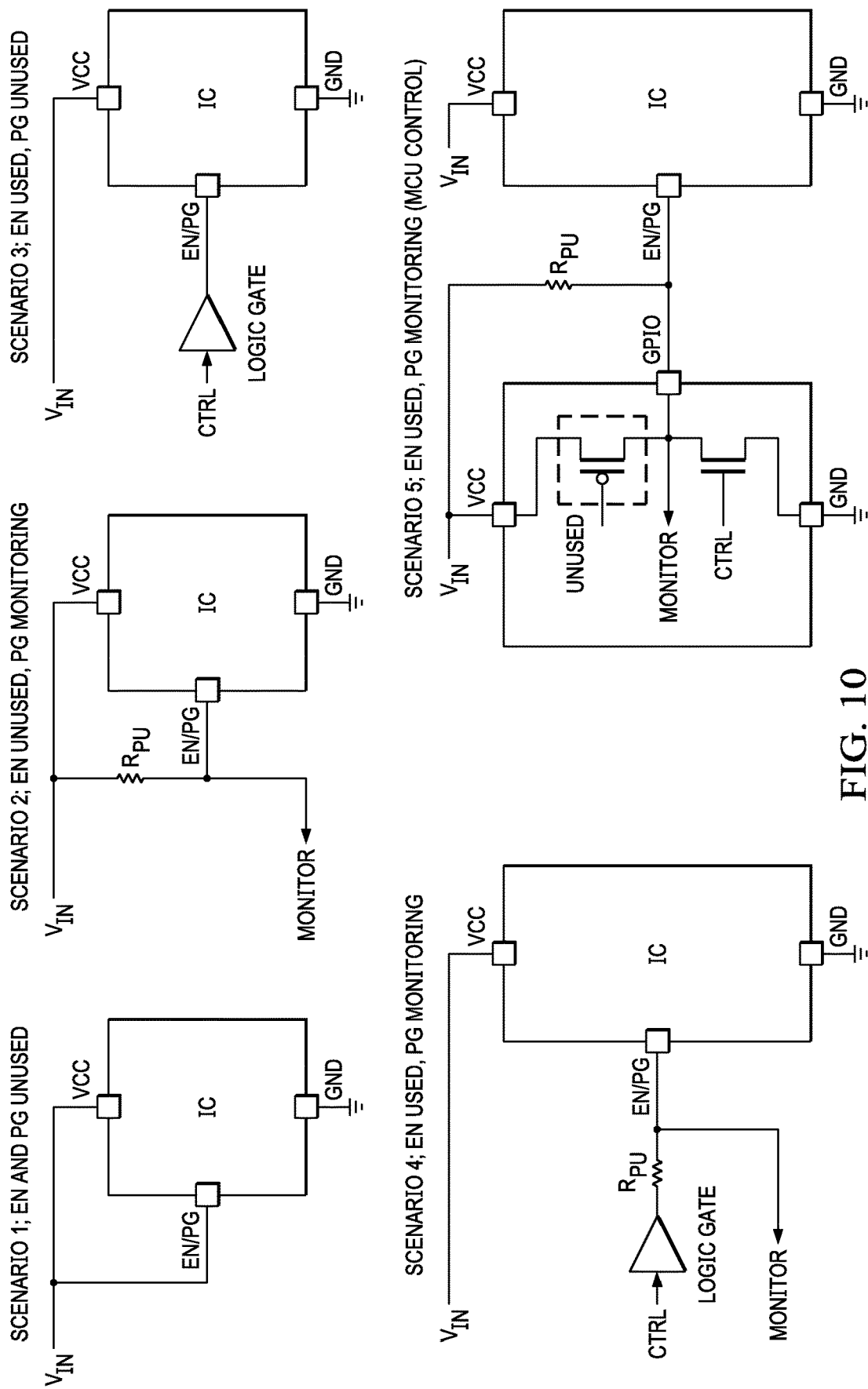
FIG. 10 illustrates interfacing scenarios.

As shown in FIG. 10 the IC can be implemented in various scenarios. In scenario 1 the enable and power good functions are not used, which is useful in circuits which don't need these functions. The supply voltage is coupled with the power supply input of the IC as well as the first pin to enable the switchable power supply. The second pin is not shown and is coupled with GND.

In scenario 2 the enable function is unused and the power good monitoring is used. The supply voltage is coupled with the power supply input of the IC as well as the first pin via a pull up resistor. The first pin is further coupled with the power good monitor circuit. The second pin is not shown and is coupled with GND.

In scenario 3 the enable function is used and the power good monitoring is unused. The supply voltage is coupled with the power supply input of the IC. An external enable signal to enable the switchable power supply is provided via a logic gate. The second pin is not shown and is coupled with GND.

In scenario 4 the enable function is used and the power good monitoring is used. The supply voltage is coupled with the power supply input of the IC. An external enable signal to enable the switchable power supply is provided via a logic gate which is coupled to the first pin via a pull up resistor. The first pin is further coupled with the power good monitor circuit. The second pin is not shown and is coupled with GND.

In scenario 5 both the enable function and the power good monitoring is used and controlled by a microcontroller. A first supply voltage is coupled with a power supply input of the IC. A second supply voltage is coupled with a power supply of the microcontroller. The first and second power supplies can be the same. A pull up resistor is coupled between the power supply of the microcontroller and the first pin of the IC. The first pin of the IC is further coupled with a general purpose input/output (GPIO) of the microcontroller. The microcontroller has a first transistor which is coupled between the supply voltage and the GPIO. The control element is provided between the GPIO and GND. Further, a monitor circuit is coupled with the GPIO. The first transistor can be used to switch on or off the control element wherein the switching is done by the microcontroller.

The operation of the integrated circuit will be explained in combination with FIG. 3. A first voltage is applied at the first pin 320. The first pin 320 is coupled with the second pin 322 via a resistive element, such as a pull down resistor, resulting in a logic low of the external power good signal. The resistive element can be the switchable resistive element discussed earlier. In response to an internal power good signal being logical high, electrically disconnecting the first pin and the second pin resulting in a logical high of the external power good signal. The step of applying the first voltage at the first pin can comprise the step of switching a control element, which can be coupled between the first pin and the second pin, such that the control element is open and not electrically conducting. If closed, the control element is able to electrically short the first and second pin to provide a lower resistance path than the path via the resistive element. In response to an internal power good signal being logic low, indicating that the switchable is not in an operating condition, the first pin and the second pin can be electrically coupled via the resistive element which results in a logic low of the external power good signal, due to the voltage across the resistive element. The first voltage at the first pin can be compared with a reference voltage to check or determine that an external enable voltage is logical high if the first voltage exceeds the reference voltage.

Modifications are possible in the described embodiments, and other embodiments are possible, within the scope of the claims.

What is claimed is:

1. An integrated circuit comprising:
   a first pin;
   a second pin;
   a latch;
   a switchable resistive element coupled between the first pin and the second pin, the switchable resistive element having a control input, and the switchable resistive element configured to have a pull down resistance state or a high resistance state responsive to the control input;
   a comparator having a comparator input, a reference input and a comparator output, the comparator input coupled to the first pin; and
   a logic circuit having a logic input, a power good input and a control output, the logic input coupled through the latch to the comparator output, and the control output coupled to the control input;
   the first pin configured to have a first voltage during the pull down resistance state, a second voltage during the pull down resistance state, and a third voltage during the high resistance state, in which the third voltage is larger than the second voltage, and a voltage at the reference input is between the first and second voltages.

2. The integrated circuit of claim 1, wherein the switchable resistive element comprises a pull down resistor connected in series with a switch, in which the control input is part of the switch, the switch is configured to close in the pull down resistance state, and the switch is configured to open in the high resistance state.

3. The integrated circuit of claim 1, wherein the switchable resistive element is a controllable resistor.

4. The integrated circuit of claim 3, wherein the controllable resistor is a transistor.

5. The integrated circuit of claim 1, wherein the switchable resistive element is configured to be a pull down path responsive to a power good signal indicating that a power supply is outside an operating range.

6. The integrated circuit of claim 1, wherein the switchable resistive element is configured to decouple the first pin from the second pin responsive to a power good signal indicating that a power supply is within an operating range.

7. The integrated circuit of claim 1, further comprising a power good monitor coupled to the first pin, the power good monitor configured to determine that a power supply is either: within an operating range, responsive to a power good signal; or outside the operating range, responsive to an enable signal that has a lower voltage level than the power good signal.

8. The integrated circuit of claim 7, wherein a voltage of the enable signal has a range of a logic low state for the power good, and a voltage of the power good signal has a range of a logic high state for the power good monitor.

9. The integrated circuit of claim 1, wherein the second pin is coupled to a reference or to a ground.

10. The integrated circuit of claim 1, further comprising an integer number of pins including the first pin and the second pin, in which the integer number is at least three and less than seven.

11. The integrated circuit of claim 1, further comprising a voltage divider that comprises: the switchable resistive element; and a second resistive element internal or external to the integrated circuit.

12. A system comprising:
an integrated circuit comprising:
a first pin;
a second pin;
a latch;
a switchable resistive element coupled between the first pin and the second pin, the switchable resistive element having a control input, and the switchable resistive element configured to have a pull down resistance state or a high resistance state responsive to the control input;
a comparator having a comparator input, a reference input and a comparator output, the comparator input coupled to the first pin; and
a logic circuit having a logic input, a power good input and a control output, the logic input coupled through the latch to the comparator output, and the control output coupled to the control input;
a supply voltage input;
a second resistive element coupled between the supply voltage input and the first pin; and
a control circuit having an enable input and an enable output, the enable input coupled to the first pin, and the control circuit comprising a control element configured to control an enable signal at the enable output responsive to the enable input;
the first pin configured to have a first voltage during the pull down resistance state, a second voltage during the pull down resistance state, and a third voltage during the high resistance state, in which the third voltage is larger than the second voltage, and a voltage at the reference input is between the first and second voltages.

13. The system of claim 12, wherein the control element is configured to control the enable signal by selectively coupling the first pin to a reference or to a ground, responsive to the enable input.

14. The system of claim 12, wherein the control circuit comprises a monitor circuit coupled to the first pin, the monitor circuit configured to monitor a power good signal that has the third voltage.

15. An integrated circuit comprising:
a first pin;
a second pin;
a switchable path coupled between the first pin and the second pin, the switchable path having a control input, and the switchable path configured to: couple the first pin to the second pin, or decouple the first pin from the second pin, responsive to the control input;
a comparator having a comparator input, a reference input and a comparator output, the comparator input coupled to the first pin;
a latch having a latch input and a latch output, the latch input coupled to the comparator output; and
a logic circuit having a logic input, a power good input and a control output, the logic input coupled to the latch output, and the control output coupled to the control input, in which the control output is responsive to the power good input.

16. The integrated circuit of claim 15, wherein the switchable path includes a pull down resistor and a switch coupled in series, and the control input is part of the switch.

* * * * *